US011344067B2

United States Patent
Lee et al.

(10) Patent No.: US 11,344,067 B2
(45) Date of Patent: May 31, 2022

(54) AEROSOL GENERATING APPARATUS HAVING AIR CIRCULATION HOLE AND GROOVE

(71) Applicant: KT&G CORPORATION, Daejeon (KR)

(72) Inventors: Jong Sub Lee, Seongnam-si (KR); Tae Hun Kim, Yongin-si (KR)

(73) Assignee: KT&G CORPORATION, Daejeon (KR)

( * ) Notice: Subject to any disclaimer, the term of this patent is extended or adjusted under 35 U.S.C. 154(b) by 132 days.

(21) Appl. No.: 16/639,018

(22) PCT Filed: Oct. 29, 2018

(86) PCT No.: PCT/KR2018/012895
§ 371 (c)(1),
(2) Date: Feb. 13, 2020

(87) PCT Pub. No.: WO2019/088611
PCT Pub. Date: May 9, 2019

(65) Prior Publication Data
US 2020/0359693 A1  Nov. 19, 2020

(30) Foreign Application Priority Data

Oct. 30, 2017  (KR) .................. 10-2017-0142578
Jul. 5, 2018  (KR) .................. 10-2018-0078296

(51) Int. Cl.
*A24F 40/20*  (2020.01)
*A24F 40/51*  (2020.01)
(Continued)

(52) U.S. Cl.
CPC ............ *A24F 40/51* (2020.01); *A24B 15/167* (2016.11); *A24D 1/20* (2020.01); *A24D 3/17* (2020.01);
(Continued)

(58) Field of Classification Search
CPC .......... A24F 40/20; A24F 40/40; A24F 40/46; A24F 40/485; A24D 1/20
See application file for complete search history.

(56) References Cited

U.S. PATENT DOCUMENTS 5,348,027 A  9/1994  Barnes et al.
5,388,594 A  2/1995  Counts et al.
(Continued)

FOREIGN PATENT DOCUMENTS

CA  2 778 903 A1  5/2011
CA  2 970 045 A1  6/2016
(Continued)

OTHER PUBLICATIONS

Communication dated Feb. 24, 2021 by the Japanese Patent Office in application No. 2020-503962.
(Continued)

*Primary Examiner* — Hae Moon Hyeon
(74) *Attorney, Agent, or Firm* — Sughrue Mion, PLLC

(57) ABSTRACT

An aerosol generating apparatus includes a heater housing including an air circulation hole provided around an inlet through which a cigarette is inserted and an air circulation groove connected to the air circulation hole, and a heater assembled in the heater housing to heat the cigarette, wherein the heater housing includes an air circulation space formed between an outer surface of the cigarette and the air circulation groove.

8 Claims, 14 Drawing Sheets

(51) Int. Cl.

| | | |
|---|---|---|
| *A24F 40/90* | (2020.01) | |
| *A24F 40/46* | (2020.01) | |
| *A24B 15/167* | (2020.01) | |
| *A24F 40/30* | (2020.01) | |
| *A24D 3/17* | (2020.01) | |
| *A24D 1/20* | (2020.01) | |
| *A24F 40/60* | (2020.01) | |
| *F21V 3/00* | (2015.01) | |
| *F21V 5/00* | (2018.01) | |
| *G02B 19/00* | (2006.01) | |
| *H05B 3/54* | (2006.01) | |
| *A24F 40/485* | (2020.01) | |
| *A24F 40/10* | (2020.01) | |
| *A24F 40/44* | (2020.01) | |
| *A24F 40/42* | (2020.01) | |
| *A24F 40/40* | (2020.01) | |
| *A24F 40/57* | (2020.01) | |
| *A24F 40/65* | (2020.01) | |
| *H05K 1/02* | (2006.01) | |
| *H05K 1/14* | (2006.01) | |
| *H05K 1/18* | (2006.01) | |
| *A24F 40/50* | (2020.01) | |
| *A24F 40/95* | (2020.01) | |
| *A24F 15/01* | (2020.01) | |
| *F21Y 115/10* | (2016.01) | |

(52) U.S. Cl.
CPC .............. *A24F 15/01* (2020.01); *A24F 40/10* (2020.01); *A24F 40/20* (2020.01); *A24F 40/30* (2020.01); *A24F 40/40* (2020.01); *A24F 40/42* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *F21Y 2115/10* (2016.08); *H05K 2201/012* (2013.01); *H05K 2201/0154* (2013.01); *H05K 2201/10219* (2013.01)

(56) References Cited

U.S. PATENT DOCUMENTS

| | | | |
|---|---|---|---|
| 5,408,574 | A | 4/1995 | Deevi et al. |
| 5,505,214 | A | 4/1996 | Collins et al. |
| 5,555,476 | A | 9/1996 | Suzuki et al. |
| 5,665,262 | A | 9/1997 | Hajaligol et al. |
| 5,692,525 | A | 12/1997 | Counts et al. |
| 5,723,228 | A | 3/1998 | Okamoto |
| 5,750,964 | A | 5/1998 | Counts et al. |
| 5,878,752 | A | 3/1999 | Adams et al. |
| 5,902,501 | A | 5/1999 | Nunnally et al. |
| 5,949,346 | A | 9/1999 | Suzuki et al. |
| 6,026,820 | A | 2/2000 | Baggett, Jr. et al. |
| 6,615,840 | B1 | 9/2003 | Fournier et al. |
| 6,803,550 | B2 | 10/2004 | Sharpe et al. |
| 6,810,883 | B2 | 11/2004 | Felter et al. |
| 7,082,825 | B2 | 8/2006 | Aoshima et al. |
| 7,594,945 | B2 | 9/2009 | Kim et al. |
| 7,682,571 | B2 | 3/2010 | Kim et al. |
| 7,726,320 | B2 | 6/2010 | Robinson et al. |
| 8,205,622 | B2 | 6/2012 | Pan |
| 8,558,147 | B2 | 10/2013 | Greim et al. |
| 8,602,037 | B2 | 12/2013 | Inagaki |
| 8,689,804 | B2 | 4/2014 | Fernando et al. |
| 8,833,364 | B2 | 9/2014 | Buchberger |
| 8,997,754 | B2 | 4/2015 | Tucker et al. |
| 9,084,440 | B2 | 7/2015 | Zuber et al. |
| 9,165,484 | B2 | 10/2015 | Choi |
| 9,295,286 | B2 | 3/2016 | Shin |
| 9,347,644 | B2 | 5/2016 | Araki et al. |
| 9,405,148 | B2 | 8/2016 | Chang et al. |
| 9,420,829 | B2 | 8/2016 | Thorens et al. |
| 9,516,899 | B2 | 12/2016 | Plojoux et al. |
| 9,532,600 | B2 | 1/2017 | Thorens et al. |
| 9,541,820 | B2 | 1/2017 | Ogawa |
| 9,693,587 | B2 | 7/2017 | Plojoux et al. |
| 9,713,345 | B2 | 7/2017 | Farine et al. |
| 9,839,238 | B2 | 12/2017 | Worm et al. |
| 9,844,234 | B2 | 12/2017 | Thorens et al. |
| 9,848,651 | B2 | 12/2017 | Wu |
| 9,854,845 | B2 | 1/2018 | Plojoux et al. |
| 9,949,507 | B2 | 4/2018 | Flick |
| 9,974,117 | B2 | 5/2018 | Qiu |
| 10,070,667 | B2 | 9/2018 | Lord et al. |
| 10,104,909 | B2 | 10/2018 | Han et al. |
| 10,104,911 | B2 | 10/2018 | Thorens et al. |
| 10,130,124 | B2 * | 11/2018 | Wong .................. H05B 1/0277 |
| 10,136,673 | B2 | 11/2018 | Mironov |
| 10,136,675 | B2 | 11/2018 | Li et al. |
| 10,143,232 | B2 | 12/2018 | Talon |
| 10,238,149 | B2 | 3/2019 | Hon |
| 10,390,564 | B2 | 8/2019 | Fernando et al. |
| 10,412,994 | B2 | 9/2019 | Schennum et al. |
| 10,426,193 | B2 | 10/2019 | Schennum et al. |
| 10,548,350 | B2 | 2/2020 | Greim et al. |
| 10,555,555 | B2 | 2/2020 | Fernando et al. |
| 10,602,778 | B2 | 3/2020 | Hu et al. |
| 10,617,149 | B2 | 4/2020 | Malgat et al. |
| 10,694,783 | B2 | 6/2020 | Jochnowitz |
| 10,701,973 | B2 | 7/2020 | Lee |
| 10,842,194 | B2 | 11/2020 | Batista et al. |
| 10,973,087 | B2 | 4/2021 | Wang et al. |
| 11,051,545 | B2 | 7/2021 | Batista et al. |
| 11,051,550 | B2 | 7/2021 | Lin et al. |
| 11,147,316 | B2 | 10/2021 | Farine et al. |
| 2003/0226837 | A1 | 12/2003 | Blake et al. |
| 2004/0089314 | A1 | 5/2004 | Felter et al. |
| 2004/0149737 | A1 | 8/2004 | Sharpe et al. |
| 2005/0142036 | A1 | 6/2005 | Kim et al. |
| 2006/0267614 | A1 | 11/2006 | Lee et al. |
| 2007/0007266 | A1 | 1/2007 | Sasaki et al. |
| 2007/0074734 | A1 | 4/2007 | Braunshteyn et al. |
| 2007/0246382 | A1 | 10/2007 | He |
| 2007/0267031 | A1 | 11/2007 | Hon |
| 2010/0313901 | A1 | 12/2010 | Fernando et al. |
| 2011/0226236 | A1 | 9/2011 | Buchberger |
| 2011/0234069 | A1 | 9/2011 | Chen et al. |
| 2013/0014772 | A1 | 1/2013 | Liu |
| 2013/0228191 | A1 | 9/2013 | Newton |
| 2013/0255675 | A1 | 10/2013 | Liu |
| 2014/0060554 | A1 | 3/2014 | Collett et al. |
| 2014/0069424 | A1 | 3/2014 | Poston et al. |
| 2014/0209105 | A1 | 7/2014 | Sears et al. |
| 2014/0217085 | A1 | 8/2014 | Alima |
| 2014/0261487 | A1 | 9/2014 | Chapman et al. |
| 2014/0286630 | A1 | 9/2014 | Buchberger |
| 2014/0338686 | A1 * | 11/2014 | Plojoux ................. A24F 40/485 131/329 |
| 2014/0339509 | A1 | 11/2014 | Choi et al. |
| 2014/0345633 | A1 | 11/2014 | Talon et al. |
| 2014/0353856 | A1 | 12/2014 | Dubief |
| 2015/0020831 | A1 | 1/2015 | Weigensberg et al. |
| 2015/0223520 | A1 | 8/2015 | Phillips et al. |
| 2015/0230521 | A1 | 8/2015 | Talon |
| 2015/0282527 | A1 | 10/2015 | Henry, Jr. |
| 2015/0327596 | A1 | 11/2015 | Alarcon et al. |
| 2016/0103364 | A1 | 4/2016 | Nam et al. |
| 2016/0128386 | A1 | 5/2016 | Chen |
| 2016/0174613 | A1 | 6/2016 | Zuber et al. |
| 2016/0205998 | A1 | 7/2016 | Matsumoto et al. |
| 2016/0255879 | A1 * | 9/2016 | Paprocki ................. A24F 40/46 |
| 2016/0321879 | A1 | 11/2016 | Oh et al. |
| 2016/0324216 | A1 | 11/2016 | Li et al. |

(56) References Cited

U.S. PATENT DOCUMENTS

| | | | |
|---|---|---|---|
| 2016/0331030 A1 | 11/2016 | Ampolini et al. | |
| 2016/0345625 A1 | 12/2016 | Liu | |
| 2017/0020195 A1 | 1/2017 | Cameron | |
| 2017/0042227 A1 | 2/2017 | Gavrielov et al. | |
| 2017/0055589 A1 | 3/2017 | Fernando et al. | |
| 2017/0119051 A1 | 5/2017 | Blandino et al. | |
| 2017/0119053 A1 | 5/2017 | Henry, Jr. et al. | |
| 2017/0143041 A1 | 5/2017 | Batista et al. | |
| 2017/0188634 A1 | 7/2017 | Plojoux et al. | |
| 2017/0197043 A1 | 7/2017 | Buchberger | |
| 2017/0197046 A1 | 7/2017 | Buchberger | |
| 2017/0214261 A1 | 7/2017 | Gratton | |
| 2017/0238609 A1 | 8/2017 | Schlipf | |
| 2017/0295844 A1 | 10/2017 | Thevenaz et al. | |
| 2017/0325505 A1 | 11/2017 | Force et al. | |
| 2017/0347715 A1 | 12/2017 | Mironov et al. | |
| 2018/0027878 A1 | 2/2018 | Dendy et al. | |
| 2018/0028993 A1 | 2/2018 | Dubief | |
| 2018/0153216 A1* | 6/2018 | Wong | H05B 3/42 |
| 2018/0160733 A1 | 6/2018 | Leadley et al. | |
| 2018/0199630 A1 | 7/2018 | Qiu | |
| 2019/0059448 A1 | 2/2019 | Talon | |
| 2019/0159524 A1 | 5/2019 | Qiu | |
| 2019/0281896 A1 | 9/2019 | Chapman et al. | |
| 2020/0093177 A1 | 3/2020 | Han et al. | |
| 2020/0093185 A1 | 3/2020 | Lim | |
| 2020/0094997 A1 | 3/2020 | Menon et al. | |
| 2020/0154765 A1 | 5/2020 | Lee et al. | |
| 2020/0196670 A1 | 6/2020 | Alarcon et al. | |
| 2020/0260790 A1 | 8/2020 | Kaufman et al. | |
| 2020/0305240 A1 | 9/2020 | Holoubek et al. | |
| 2020/0329772 A1 | 10/2020 | Kim et al. | |
| 2020/0359681 A1 | 11/2020 | Han et al. | |
| 2020/0404969 A1 | 12/2020 | Zuber et al. | |

FOREIGN PATENT DOCUMENTS

| | | | |
|---|---|---|---|
| CN | 1078621 A | 11/1993 | |
| CN | 1126425 A | 7/1996 | |
| CN | 1190335 A | 8/1998 | |
| CN | 1280661 A | 1/2001 | |
| CN | 1491598 A | 4/2004 | |
| CN | 1633247 A | 6/2005 | |
| CN | 1871987 A | 12/2006 | |
| CN | 101277622 A | 10/2008 | |
| CN | 101324490 A | 12/2008 | |
| CN | 101518361 A | 9/2009 | |
| CN | 101557728 A | 10/2009 | |
| CN | 101637308 A | 2/2010 | |
| CN | 201657047 U | 11/2010 | |
| CN | 102264251 A | 11/2011 | |
| CN | 102595943 A | 7/2012 | |
| CN | 202385727 U | 8/2012 | |
| CN | 102665459 A | 9/2012 | |
| CN | 103099319 A | 5/2013 | |
| CN | 202907797 U | 5/2013 | |
| CN | 203040065 U | 7/2013 | |
| CN | 103271447 A | 9/2013 | |
| CN | 103477252 A | 12/2013 | |
| CN | 103519351 A | 1/2014 | |
| CN | 103653257 A | 3/2014 | |
| CN | 103653258 A | 3/2014 | |
| CN | 203492793 U | 3/2014 | |
| CN | 103889258 A | 6/2014 | |
| CN | 103974635 A | 8/2014 | |
| CN | 103974638 A | 8/2014 | |
| CN | 103974640 A | 8/2014 | |
| CN | 103997922 A | 8/2014 | |
| CN | 104146353 A | 11/2014 | |
| CN | 104188110 A | 12/2014 | |
| CN | 104219973 A | 12/2014 | |
| CN | 204120226 U | 1/2015 | |
| CN | 204146340 U | 2/2015 | |
| CN | 104423130 A | 3/2015 | |
| CN | 204393344 U | 6/2015 | |
| CN | 104886776 A | 9/2015 |
| CN | 105188430 A | 12/2015 |
| CN | 204838003 U | 12/2015 |
| CN | 105326092 A | 2/2016 |
| CN | 205072064 U | 3/2016 |
| CN | 205180371 U | 4/2016 |
| CN | 105722416 A | 6/2016 |
| CN | 205358225 U | 7/2016 |
| CN | 105852221 A | 8/2016 |
| CN | 205456064 U | 8/2016 |
| CN | 205624474 U | 10/2016 |
| CN | 106136331 A | 11/2016 |
| CN | 106163304 A | 11/2016 |
| CN | 106170215 A | 11/2016 |
| CN | 205671480 U | 11/2016 |
| CN | 106231934 A | 12/2016 |
| CN | 106235419 A | 12/2016 |
| CN | 205831079 U | 12/2016 |
| CN | 106418729 A | 2/2017 |
| CN | 106473232 A | 3/2017 |
| CN | 106473233 A | 3/2017 |
| CN | 106490686 A | 3/2017 |
| CN | 106723379 A | 5/2017 |
| CN | 106793834 A | 5/2017 |
| CN | 206314585 U | 7/2017 |
| CN | 106998816 A | 8/2017 |
| CN | 107105772 A | 8/2017 |
| CN | 206442590 U | 8/2017 |
| CN | 206443214 U | 8/2017 |
| CN | 107183789 A | 9/2017 |
| CN | 206462413 U | 9/2017 |
| CN | 107249366 A | 10/2017 |
| CN | 107278125 A | 10/2017 |
| CN | 206547882 U | 10/2017 |
| CN | 107801375 A | 3/2018 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |
| EP | 1 947 965 A2 | 7/2008 |
| EP | 2 201 850 A1 | 6/2010 |
| EP | 2 316 286 A1 | 5/2011 |
| EP | 2 327 318 A1 | 6/2011 |
| EP | 2 340 729 A1 | 7/2011 |
| EP | 2368449 A1 | 9/2011 |
| EP | 2 677 273 A1 | 12/2013 |
| EP | 2 921 065 A1 | 9/2015 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| GB | 2 301 894 A | 12/1996 |
| GB | 2514893 A | 12/2014 |
| JP | 62-15793 A | 1/1987 |
| JP | 6-73784 U | 10/1994 |
| JP | 7-72809 A | 3/1995 |
| JP | 7-184627 A | 7/1995 |
| JP | 9-75058 A | 3/1997 |
| JP | 9-161822 A | 6/1997 |
| JP | 9-228919 A | 9/1997 |
| JP | 10-37781 A | 2/1998 |
| JP | 2003-527127 A | 9/2003 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2013-509160 A | 3/2013 |
| JP | 2013-524835 A | 6/2013 |
| JP | 2014-216287 A | 11/2014 |
| JP | 2014-533513 A | 12/2014 |
| JP | 2015-13192 A | 1/2015 |

(56) References Cited

FOREIGN PATENT DOCUMENTS

| | | |
|---|---|---|
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-506901 A | 3/2017 |
| JP | 2017-510270 A | 4/2017 |
| JP | 2017-511123 A | 4/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A1 | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/015826 A1 | 2/2011 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/174657 A1 | 11/2015 |
| WO | 2015/177046 A1 | 11/2015 |
| WO | 2015/189388 A1 | 12/2015 |
| WO | 2016/009202 A1 | 1/2016 |
| WO | 2016/012795 A1 | 1/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/133056 A1 | 8/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 2020-501446.
Communication dated Mar. 16, 2021 by the Japanese Patent Office in application No. 2020-521441.
Communication dated Feb. 9, 2021 by the Japanese Patent Office in application No. 2020-501205.
Communication dated Mar. 16, 2021 by the European Patent Office in application No. 18806877.9.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.
Office Action dated Oct. 8, 2019 in Korean Application No. 10-2018-0072935.
Office Action dated Sep. 6, 2019 in Korean Application No. 10-2018-0069645.
Office Action dated Jul. 10, 2019 in Korean Application No. 10-2018-0064487.
Office Action dated Jun. 24, 2019 in Korean Application No. 10-2018-0062137.

(56) References Cited

OTHER PUBLICATIONS

Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.
International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR2018/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Office Action dated Apr. 5, 2019 in Korean Application No. 10-2019-0017393.
Office Action dated Apr. 25, 2019 in Korean Application No. 10-2019-0033722.
Office Action dated Apr. 25, 2019 in Korean Application No. 10-2019-0033723.
Office Action dated Jun. 7, 2021 in Canadian Application No. 3,076,886.
Office Action dated Feb. 9, 2018 in Korean Application No. 10-2017-0058786.
Communication dated Jul. 27, 2020 by the Russian Patent Office in application No. 2020110821.
Communication dated Jun. 11, 2020 by the Korean Patent Office in application No. 10-2018-0051469.
Extended European Search Report dated Jan. 15, 2021 in European Application No. 18799246.6.
Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.
Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Extended European Search Report dated Oct. 15, 2021 in European Application No. 18872138.5.
Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Office Action dated Jan. 24, 2022 in Chinese Application No. 201880030661.5.
Office Action dated Dec. 24, 2021 in Chinese Application No. 201880055847.6.
Office Action dated Dec. 20, 2021 in Chinese Application No. 201880048655.2.
Office Action dated Jan. 4, 2022 in Chinese Application No. 201880048703.8.
Office Action dated Jan. 18, 2022 in Chinese Application No. 201880052857.4.
Office Action dated Jan. 30, 2022 in Chinese Application No. 201880052855.5.
"PCB Design and Processing", Seping, pp. 32-35, Beijing Institute of Technology Publishing House, Feb. 2017, Feb. 28, 2017 (6 pages total).
Office Action dated Dec. 31, 2021 in Chinese Application No. 201880049189.X.

(56) References Cited

OTHER PUBLICATIONS

Office Action dated Feb. 28, 2022 in Chinese Application No. 201880063459.2.
Communication dated Mar. 29, 2022 in Japanese Application No. 2020-522897.
Office Action dated Mar. 3, 2022 in Chinese Application No. 201880058682.8.
Wenxue Geng, "Technology Manual of Programmable Controller", Science Technology Document Publisher, 1st Edition, Apr. 30, 1996, pp. 132 (2 pages total).

* cited by examiner

AEROSOL GENERATING APPARATUS HAVING AIR CIRCULATION HOLE AND GROOVE

CROSS REFERENCE TO RELATED APPLICATIONS

This application is a National Stage of International Application No. PCT/KR2018/012895, filed Oct. 29, 2018, claiming priorities to Korean Patent Application No. 10-2017-0142578, filed Oct. 30, 2017 and Korean Patent Application No. 10-2018-0078296, filed Jul. 5, 2018.

TECHNICAL FIELD

The present disclosure relates to an aerosol generating apparatus, and more particularly, to a structure of an aerosol generating apparatus.

BACKGROUND ART

Recently, the demand for alternative methods to overcome the shortcomings of general cigarettes has increased. For example, there is an increasing demand for a method of generating aerosol by heating an aerosol generating material in cigarettes, rather than by burning cigarettes. Accordingly, studies on a heating-type cigarette and a heating-type aerosol generating device have been actively conducted. In a heating-type aerosol generating apparatus, a cigarette is heated by using a heater. In this case, because the heat generated from the heater stays inside the aerosol generating apparatus, the temperature of the heater for heating the cigarette may change to an unintended temperature range or it may be difficult to control the temperature of the heater. Due to this phenomenon, the smoking feeling of a user of an aerosol generating apparatus may degrade, and thus there is a need for efforts to suitably control the heat generated from the heater inside an aerosol generating apparatus.

DESCRIPTION OF EXEMPLARY EMBODIMENTS

Technical Problem

Provided is an aerosol generating apparatus according to various exemplary embodiments. The technical problems to be solved by the present disclosure are not limited to the technical problems described above, and other technical problems may be derived from the following exemplary embodiments.

Solution to Problem

According to an aspect of the present disclosure, an aerosol generating apparatus includes: a heater housing accommodating a cigarette and including at least one air circulation hole provided around an inlet through which the cigarette is inserted and at least one air circulation groove formed to extend along a lengthwise direction in at least a portion of an inner wall and connected to the air circulation hole; and a heater assembled in the heater housing to heat the cigarette, wherein in the heater housing, when the cigarette is inserted therein, an air circulation space is formed between an outer surface of the inserted cigarette and the air circulation groove.

Also, a first airflow path formed by the air circulation space and the air circulation hole may not meet a second airflow path formed in the aerosol generating apparatus for inhalation of an aerosol generated from the cigarette.

Also, the first airflow path may include an airflow path for discharging air heated by the heater to the outside through the air circulation hole.

Also, the air circulation space may be provided as a space for convection of air heated by the heater outside the heater.

Also, the air circulation hole may include an inlet through which outside air flows into the air circulation space and an outlet through which air inside the air circulation space flows out.

Also, the at least one air circulation hole may be provided at positions spaced apart from each other along a circumferential direction of an upper surface around the inlet through which the cigarette is inserted in the heater housing.

Also, the number of the at least one air circulation groove may be equal to the number of the at least one air circulation hole.

Also, the heater may correspond to a cylindrical film heater for heating an outer surface of the cigarette.

According to another aspect of the present disclosure, an aerosol generating apparatus includes: a first region accommodating and heating a cigarette which is a solid aerosol generating source; and a second region accommodating a cartridge which is a liquid aerosol generating source, the first region including: a heater housing accommodating a cigarette and including at least one air circulation hole provided around an inlet through which the cigarette is inserted and at least one air circulation groove formed to extend along a lengthwise direction in at least a portion of an inner wall and connected to the air circulation hole; and a heater assembled in the heater housing to heat the cigarette, wherein in the heater housing, when the cigarette is inserted therein, an air circulation space is formed between an outer surface of the inserted cigarette and the air circulation groove.

Also, a first airflow path formed by the air circulation space and the air circulation hole may not meet a second airflow path formed in the aerosol generating apparatus for inhalation of an aerosol generated in the first region and the second region.

Advantageous Effects of Disclosure

According to the above, because the air heated by the heater may be discharged to the outside through the hole formed in the heater housing, the heating temperature of the heater may be more easily controlled and also a better smoking feel may be provided to the user.

BEST MODE

Figure 1:
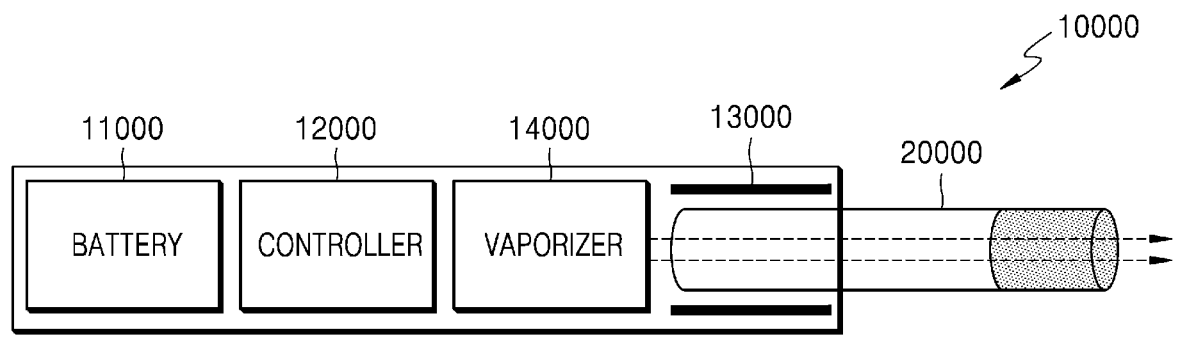
FIGS. 1 and 2 are diagrams showing examples in which a cigarette is inserted into an aerosol generating device.

According to an aspect of the present disclosure, an aerosol generating apparatus includes: a heater housing accommodating a cigarette and including at least one air circulation hole provided around an inlet through which the cigarette is inserted and at least one air circulation groove formed to extend along a lengthwise direction in at least a portion of an inner wall and connected to the air circulation hole; and a heater assembled in the heater housing to heat the cigarette, wherein in the heater housing, when the cigarette is inserted therein, an air circulation space is formed between an outer surface of the inserted cigarette and the air circulation groove.

According to another aspect of the present disclosure, an aerosol generating apparatus includes: a first region accommodating and heating a cigarette which is a solid aerosol generating source; and a second region accommodating a cartridge which is a liquid aerosol generating source, the first region including: a heater housing accommodating a cigarette and including at least one air circulation hole provided around an inlet through which the cigarette is inserted and at least one air circulation groove formed to extend along a lengthwise direction in at least a portion of an inner wall and connected to the air circulation hole; and a heater assembled in the heater housing to heat the cigarette, wherein in the heater housing, when the cigarette is inserted therein, an air circulation space is formed between an outer surface of the inserted cigarette and the air circulation groove.

MODE OF DISCLOSURE

Hereinafter, exemplary embodiments will be described in detail merely as examples with reference to the accompanying drawings. It is to be understood that the following descriptions are merely intended to illustrate exemplary embodiments and are not intended to limit the scope of the present disclosure. Those that may be easily derived from the detailed description and the exemplary embodiments by those of ordinary skill in the art should be construed as falling within the scope of the present disclosure.

The term such as "comprise" or "include" used herein should not be construed as necessarily including all of the elements or operations described herein, and should be construed as not including some of the described elements or operations or as further including additional elements or operations.

Also, although terms including ordinals such as "first" or "second" may be used herein to describe various elements, these elements should not be limited by these terms. These terms are only used to distinguish one element from another element.

With respect to the terms in the various exemplary embodiments, the general terms which are currently and widely used are selected in consideration of functions of structural elements in the various exemplary embodiments of the present disclosure. However, meanings of the terms can be changed according to intention, a judicial precedence, the appearance of a new technology, and the like. In addition, in certain cases, a term which is not commonly used can be selected. In such a case, the meaning of the term will be described in detail at the corresponding portion in the description of the present disclosure. Therefore, the terms used in the various exemplary embodiments of the present disclosure should be defined based on the meanings of the terms and the descriptions provided herein.

Throughout the specification, 'top' and 'bottom' may be determined based on the mouth of a user. Assuming that the user smokes a cigarette accommodated in an aerosol generating apparatus by using the aerosol generating apparatus, the side close to the user's mouth may be the top side and the side distant from the user's mouth may be the bottom side. For example, when the user smokes a cigarette accommodated in an aerosol generating apparatus by using the aerosol generating apparatus, because a cigarette rod is a component located most distant from the user's mouth, the cigarette rod may correspond to the bottom side of the cigarette.

The present exemplary embodiments relate to aerosol generating apparatuses, and detailed descriptions of matters widely known to those of ordinary skill in the art will be omitted for conciseness.

Figure 2:
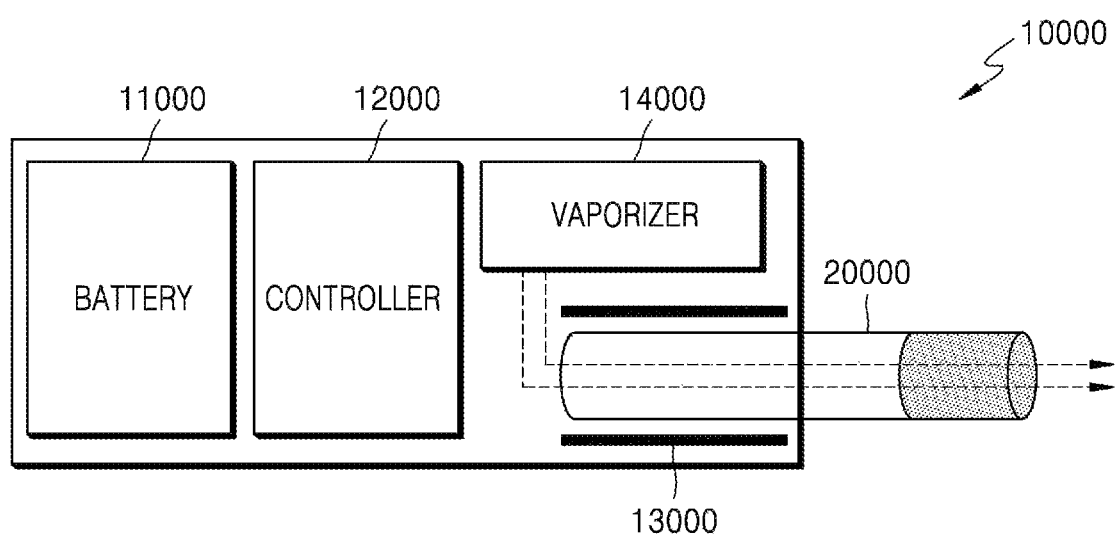

Hereinafter, exemplary embodiments of the present disclosure will be described in detail with reference to the drawings FIGS. 1 and 2 are diagrams showing examples in which a cigarette is inserted into an aerosol generating device.

Referring to FIGS. 1 and 2, an aerosol generating device 10000 includes a battery 11000, a controller 12000, a heater 13000, and a vaporizer 14000. Also, a cigarette 20000 may be inserted into an inner space of the aerosol generating device 10000.

FIGS. 1 and 2 only illustrate components of the aerosol generating device 10000, which are related to the present exemplary embodiment. Therefore, it will be understood by one of ordinary skill in the art that other general-purpose components may be further included in the aerosol generating device 10000, in addition to the components illustrated in FIGS. 1 and 2.

Also, FIGS. 1 and 2 illustrate that the aerosol generating device 10000 includes the heater 13000. However, as necessary, the heater 13000 may be omitted.

FIG. 1 illustrates that the battery 11000, the controller 12000, the vaporizer 14000, and the heater 13000 are arranged in series. On the other hand, FIG. 2 illustrates that the vaporizer 14000 and the heater 13000 are arranged in parallel. However, the internal structure of the aerosol generating device 10000 is not limited to the structures illustrated in FIG. 1 or FIG. 2. In other words, according to the design of the aerosol generating device 10000, the battery 11000, the controller 12000, the vaporizer 14000, and the heater 13000 may be differently arranged.

When the cigarette 20000 is inserted into the aerosol generating device 10000, the aerosol generating device 10000 may operate the vaporizer 14000 to generate aerosol. The aerosol generated by the vaporizer 14000 is delivered to the user by passing through the cigarette 20000. The vaporizer 14000 will be described in more detail later.

The battery 11000 may supply power to be used for the aerosol generating device 10000 to operate. For example, the battery 11000 may supply power to heat the heater 13000 or the vaporizer 14000 and may supply power for operating the controller 12000. Also, the battery 11000 may supply power for operations of a display, a sensor, a motor, etc. mounted in the aerosol generating device 10000.

The controller 12000 may generally control operations of the aerosol generating device 10000. In detail, the controller 12000 may control not only operations of the battery 11000, the heater 13000, and the vaporizer 14000, but also operations of other components included in the aerosol generating device 10000. Also, the controller 12000 may check a state of each of the components of the aerosol generating device 10000 to determine whether or not the aerosol generating device 10000 is in an operable state.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 13000 may be heated by the power supplied from the battery 11000. For example, when the cigarette 20000 is inserted into the aerosol generating device 10000, the heater 13000 may be located outside the cigarette 20000 and increase a temperature of an aerosol generating material in the cigarette 20000.

The heater 13000 may include an electro-resistive heater. For example, the heater 13000 may include an electrically conductive track, and the heater 13000 may be heated when currents flow through the electrically conductive track. However, the heater 13000 is not limited to the example described above and may include any other heaters which may be heated to a desired temperature. Here, the desired temperature may be pre-set in the aerosol generating device 10000 or may be set by a user.

As another example, the heater 13000 may include an induction heater. In detail, the heater 13000 may include an electrically conductive coil for heating a cigarette in an induction heating method, and the cigarette may include a susceptor which may be heated by the induction heater.

FIGS. 1 and 2 illustrate that the heater 13000 is positioned outside the cigarette 20000, but the position of the cigarette 20000 is not limited thereto. For example, the heater 13000 may include a tube-type heating element, a plate-type heating element, a needle-type heating element, or a rod-type heating element, and may heat the inside or the outside of the cigarette 20000, according to the shape of the heating element.

Also, the aerosol generating device 10000 may include a plurality of heaters 13000. Here, the plurality of heaters 13000 may be inserted into the cigarette 20000 or may be arranged outside the cigarette 20000. Also, some of the plurality of heaters 13000 may be inserted into the cigarette 20000, and the others may be arranged outside the cigarette 20000. In addition, the shape of the heater 13000 is not limited to the shapes illustrated in FIGS. 1 and 2 and may include various shapes.

The vaporizer 14000 may generate aerosol by heating a liquid composition and the generated aerosol may pass through the cigarette 20000 to be delivered to a user. In other words, the aerosol generated by the vaporizer 14000 may move along an air flow passage of the aerosol generating device 10000. The air flow passage may be configured such that the aerosol generated by the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be formed to be detachable from the vaporizer 14000 or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be wound around the liquid delivery element. The heating element may be heated by electrical current and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include general-purpose components in addition to the battery 11000, the controller 12000, and the heater 13000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.). Also, the aerosol generating device 10000 may be formed as a structure where, even when the cigarette 20000 is inserted into the aerosol generating device 10000, external air may be introduced or internal air may be discharged.

Although not illustrated in FIGS. 1 and 2, a cradle may be used with the aerosol generating device 10000 to form a system. For example, the cradle may be used to charge the battery 11000 of the aerosol generating device 10000. Alternatively, the heater 13000 may be heated when the cradle and the aerosol generating device 10000 are coupled to each other.

The cigarette 20000 may be similar to a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, only a portion of the first portion may be inserted into the aerosol generating device 10000. Otherwise, the entire first portion and a portion of the second portion may be inserted into the aerosol generating device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 10000. For example, opening and closing of the air passage and/or a size of the air passage may be adjusted by the user. Accordingly, the amount of smoke and smoking satisfaction may be adjusted by the user. As another example, the external air may flow into the cigarette 20000 through at least one hole formed in a surface of the cigarette 20000.

Hereinafter, an example of the cigarette 20000 will be described with reference to FIG. 3.

Figure 3:
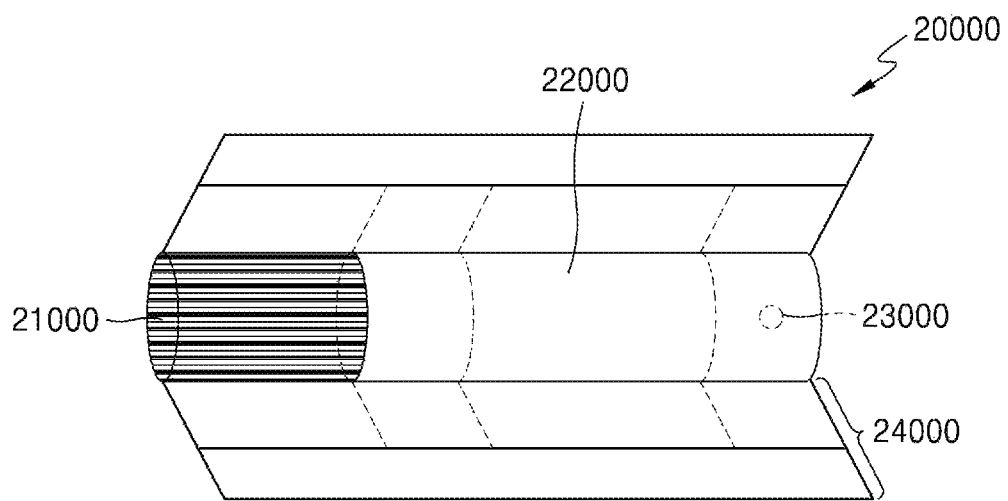
FIG. 3 is a drawing illustrating an example of a cigarette.

FIG. 3 is a drawing illustrating an example of a cigarette.

Referring to FIG. 3, the cigarette 20000 may include a tobacco rod 21000 and a filter rod 22000. The first portion described above with reference to FIGS. 1 and 2 may include the tobacco rod 21000, and the second portion may include the filter rod 22000.

FIG. 3 illustrates that the filter rod 22000 includes a single segment. However, the filter rod 22000 is not limited thereto. In other words, the filter rod 22000 may include a plurality of segments. For example, the filter rod 22000 may include a first segment configured to cool aerosol and a second segment configured to filter a certain component included in the aerosol. Also, as necessary, the filter rod 22000 may further include at least one segment configured to perform other functions.

The cigarette 2000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged using separate wrappers, may be combined and packaged together using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers and which are coupled to each other, may be re-packaged using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a heat conductive material. For example, the heat conductive material may be, but is not limited to, a metal foil such as aluminum foil. For example, the heat conductive material surrounding the tobacco rod 21000 may uniformly distribute heat transmitted to the tobacco rod 21000, and thus, the heat conductivity applied to the tobacco rod may be increased and taste of the tobacco may be improved. Also, the heat conductive material surrounding the tobacco rod 21000 may function as a susceptor heated by the induction heater. Here, although not illustrated in the drawings, the tobacco rod 21000 may further include an additional susceptor, in addition to the heat conductive material surrounding the tobacco rod 21000.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a configuration in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In some exemplary embodiments, the cooling segment may include a cellulose acetate filter having a plurality of holes. However, the cooling segment is not limited to the above-described example and any other cooling segment that is capable of cooling the aerosol may be used.

Although not illustrated in FIG. 3, the cigarette 20000 according to an exemplary embodiment may further include a front-end filter. The front-end filter may be located on a side of the tobacco rod 21000, which is the side not facing the filter rod 22000. The front-end filter may prevent the tobacco rod 21000 from being detached and prevent liquefied aerosol from flowing into the aerosol generating device 10000 (FIGS. 1 and 2) from the tobacco rod 21000, during smoking.

Figure 4A:
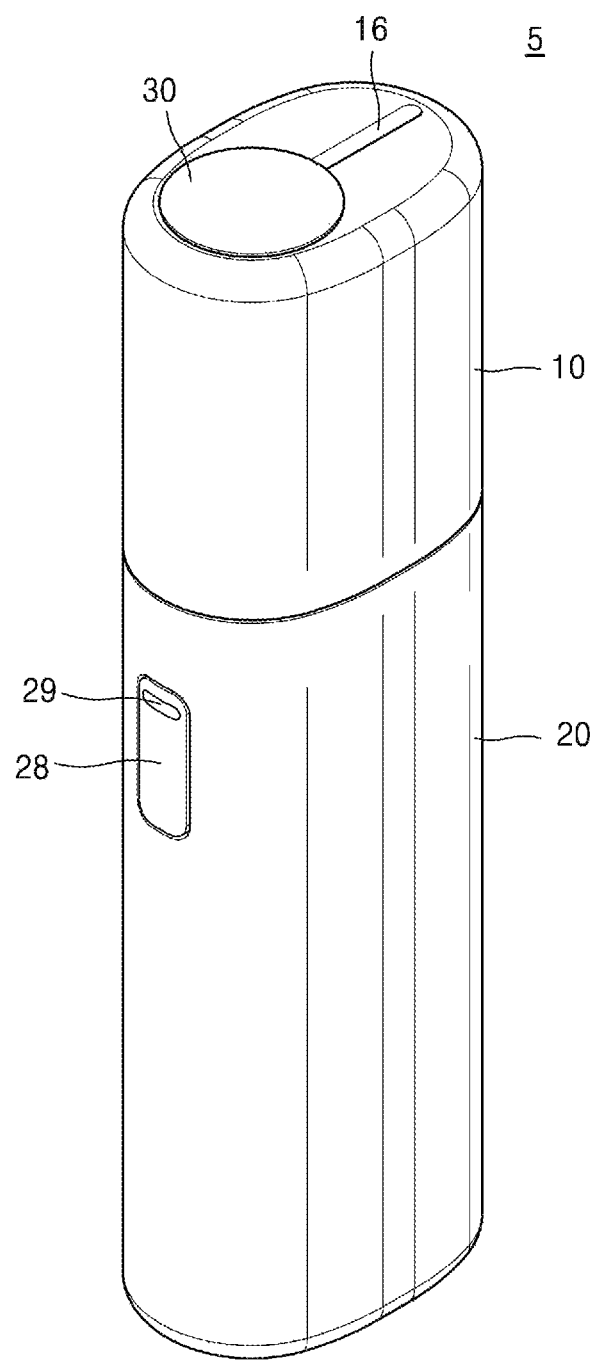
FIG. 4A is a perspective view of an aerosol generating apparatus according to an exemplary embodiment.
Figure 4B:
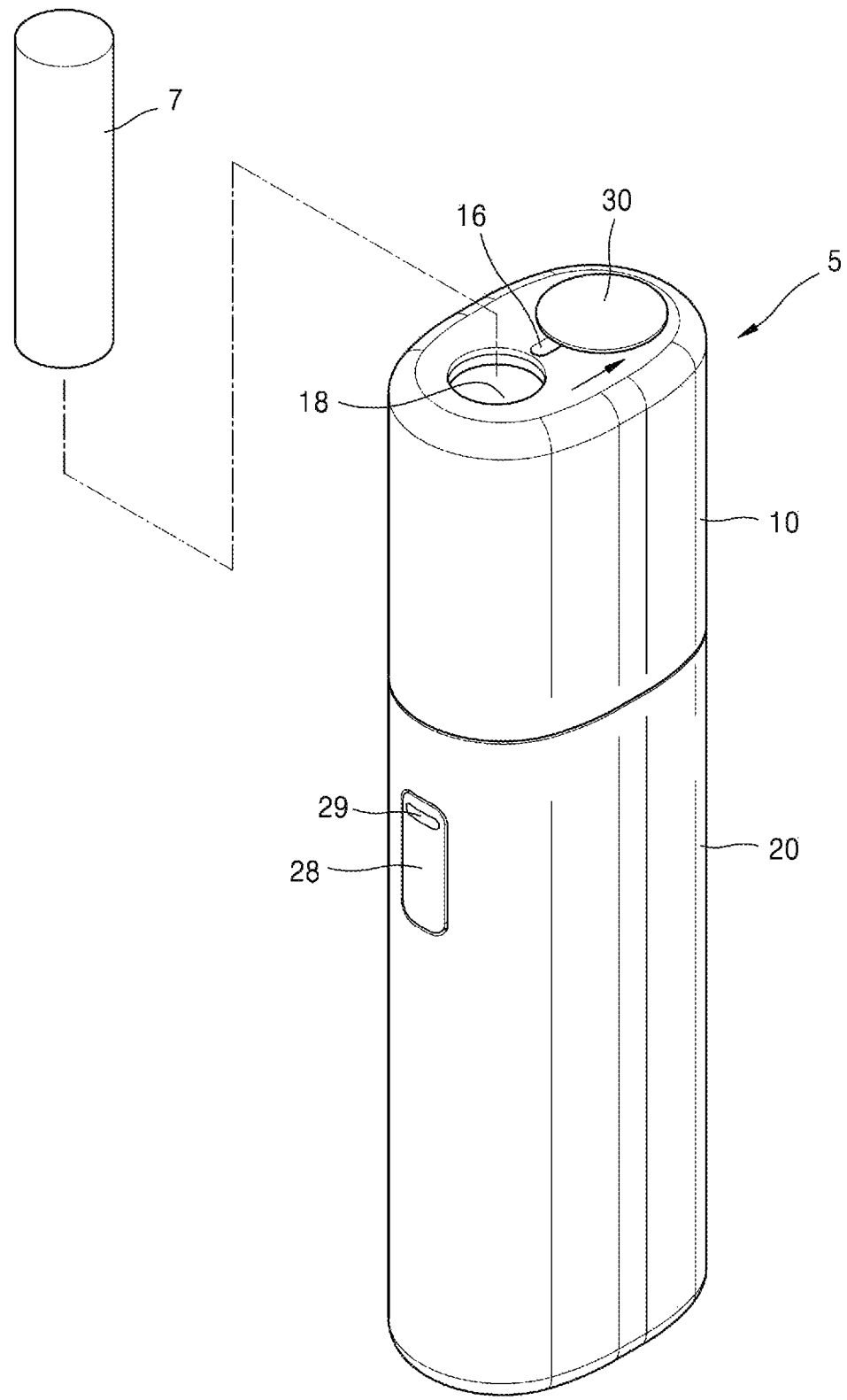
FIG. 4B is a perspective view illustrating an operation state of the aerosol generating apparatus illustrated in FIG. 4A.

FIG. 4A is a perspective view of an aerosol generating apparatus according to an exemplary embodiment, and FIG. 4B is a perspective view illustrating an operation state of the aerosol generating apparatus illustrated in FIG. 4A.

An aerosol generating apparatus 5 according to the exemplary embodiment illustrated in FIGS. 4A and 4B may include an upper case 10 and a lower case 20 detachably coupled to each other, and a cover 30 slidably installed at the upper surface of the upper case 10.

At the upper surface of the upper case 10, a slot 16 which extends along the sliding direction of the cover 30 and connects the outside and inside of the upper case 10 may be formed. Also, a cigarette insertion hole 18 into which a cigarette 7 is inserted may be formed. When the cover 30 moves along the slot 16 formed at the upper surface of the upper case 10, the cigarette insertion hole 18 may be exposed to the outside and thus the cigarette 7 may be inserted into the cigarette insertion hole 18. Here, the cigarette 7 may be an example of a solid aerosol generating source used in the aerosol generating apparatus 5.

Meanwhile, as the cover 30 slides along the upper surface of the upper case 10, various preparation operations may be executed in conjunction with an opening operation of the cigarette insertion hole 18. For example, at the moment when the cigarette insertion hole 18 is opened by the cover 30, a preliminary heating operation of a heater provided in the aerosol generating apparatus 5, an operation of recognizing the user, or the like may be executed and furthermore various other operations may be executed.

Outside the lower case 20 of the aerosol generating apparatus 5, a button 28 may be installed and operated by the user. Also, a light emitting diode (LED) 29 for indicating an internal operation state of the aerosol generating apparatus 5 by emitting light in various colors may be installed.

Figure 5:
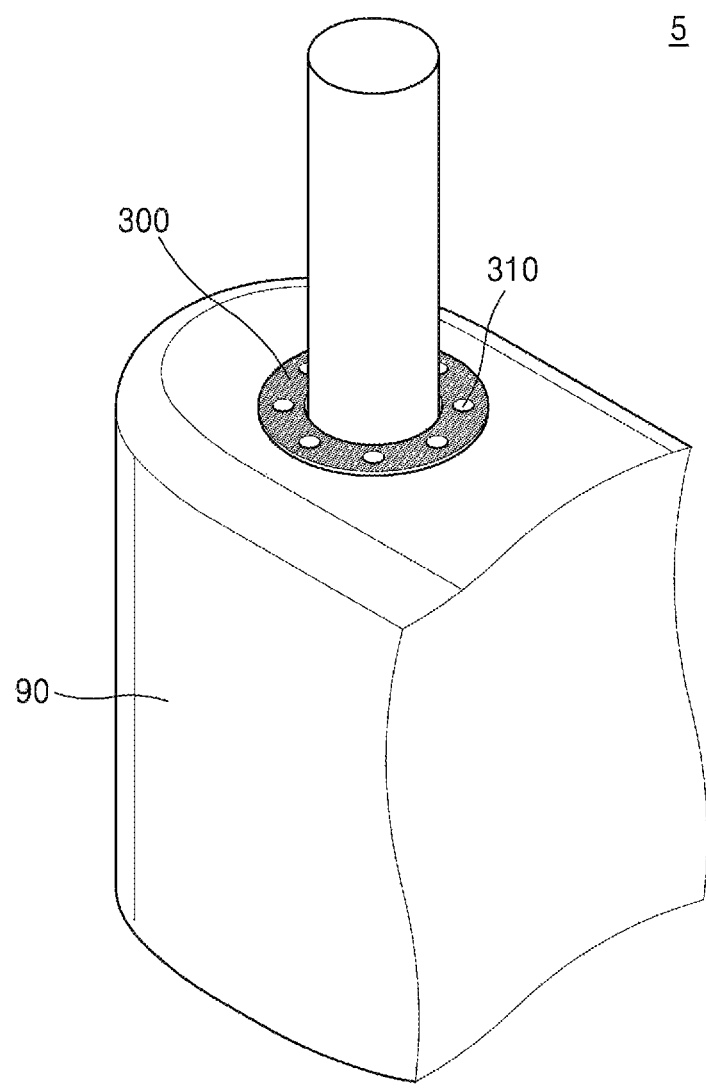
FIG. 5 is a diagram for describing a case where a cigarette is inserted into an upper protruding portion of an aerosol generating apparatus, according to an exemplary embodiment.

FIG. 5 illustrates a case where a cigarette is inserted into an upper protruding portion of an aerosol generating apparatus, according to an exemplary embodiment.

Referring to FIG. 5, when an upper protruding portion 90 of the aerosol generating apparatus 5 is viewed obliquely from above in a state where the upper case 10 (see FIG. 4A) of the aerosol generating apparatus 5 is detached therefrom, the upper surface of a heater housing 300 installed in the upper protruding portion 90 may be viewed.

At least one air circulation hole 310 may be formed in the heater housing 300. Each air circulation hole 310 may be connected to an air circulation groove of the inner wall of the heater housing 300 which extends along the lengthwise direction of the heater housing 300. When a cigarette is inserted into the upper protruding portion 90, an air circulation space may be formed between the air circulation groove and the cigarette. The air circulation hole 310 may provide a circulation path between the outside air and the air undergoing convection in the air circulation space. The structural aspect of the air circulation space and the air circulation groove of the inner wall of the heater housing 300 will be described below in more detail.

Due to the air circulation hole 310 formed at the upper surface of the heater housing 300 and the air circulation space connected to the air circulation hole 310, the air heated by a heater such as a film heater provided in the upper protruding portion 90 may be discharged to the outside. That is, as the heated air is discharged to the outside through the air circulation space or the outside air is introduced into the air circulation space through the air circulation hole 310, the temperature inside the upper protruding portion 90 (e.g., the temperature of the heater and the periphery thereof) which has been raised by a heating operation of the heater such as a film heater may be effectively reduced. Accordingly, the heating temperature of the heater for heating the inserted cigarette may be easily controlled, and also the smoking satisfaction of the user of the aerosol generating apparatus may be further improved.

Figure 6A:
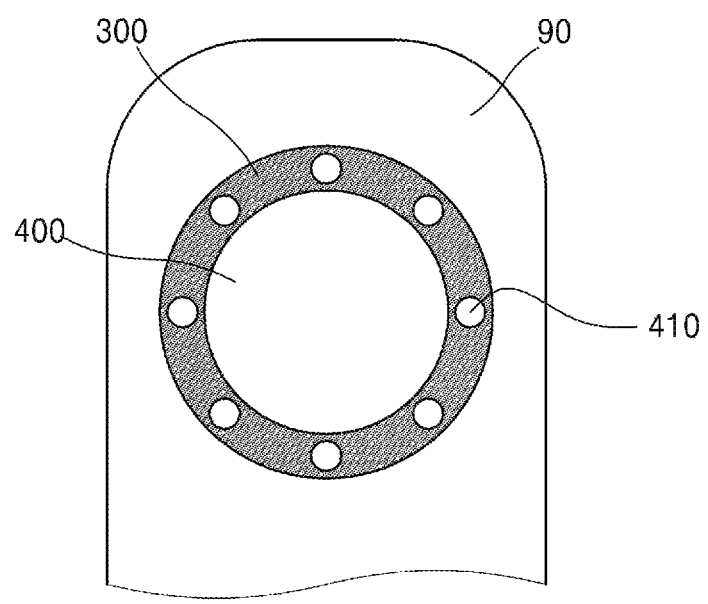
FIGS. 6A and 6B are diagrams illustrating an upper protruding portion of a lower case when an upper case is detached from an aerosol generating apparatus, according to an exemplary embodiment.
Figure 6B:
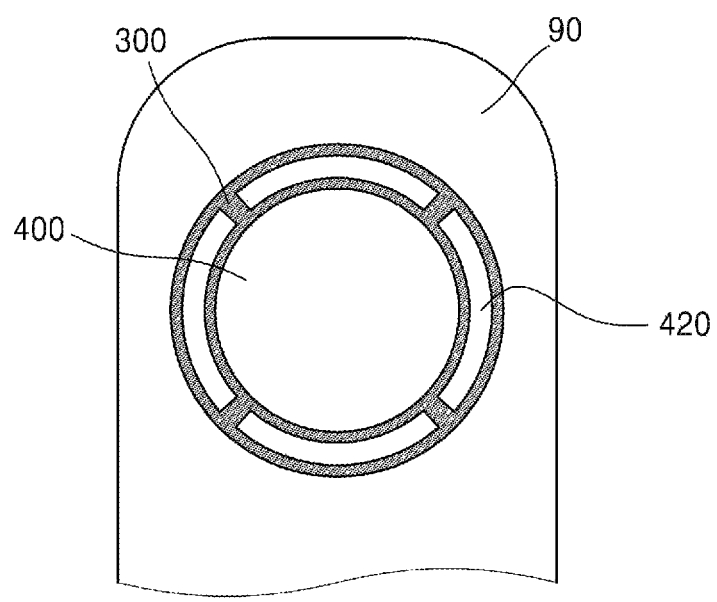

FIGS. 6A and 6B are diagrams illustrating an upper protruding portion of a lower case when an upper case is detached from an aerosol generating apparatus, according to an exemplary embodiment.

As described above, the heater housing 300 may be installed in the upper protruding portion 90. The heater housing 300 may be a structure for supporting a cigarette to be inserted into the aerosol generating apparatus 5 (see FIG. 4A), and a heater such as a film heater for heating the cigarette may be additionally installed inside the heater housing 300.

When the upper protruding portion 90 of the aerosol generating apparatus 5 is viewed obliquely from above in a state where the upper case 10 (see FIG. 4A) of the aerosol generating apparatus 5 is detached therefrom, the upper surface of the heater housing 300 installed in the upper protruding portion 90 may be viewed.

The upper surface of the heater housing 300 may have a hollow circular shape, and the cigarette may be inserted through a hollow space 400. The diameter of the hollow space 400 at the upper surface of the heater housing 300 may be slightly larger than the diameter of the cigarette so that the cigarette may be accommodated and supported.

As illustrated in FIG. 6A, eight air circulation holes 410 may be formed at the upper surface of the heater housing 300. As described in FIG. 5, the eight air circulation holes 410 each may correspond to a circulation path for discharging the air undergoing convection in the air circulation space formed between the inserted cigarette and the air circulation groove of the inner wall of the heater housing 300 to the outside or introducing the outside air into the air circulation space.

Referring to FIG. 6B, unlike the shape of the air circulation holes 410 of FIG. 6A, four air circulation holes 420 spaced apart from each other and extending along the circumference of the upper surface of the heater housing 300 may be formed at the upper surface of the heater housing 300. Although the shape and number thereof are different from the shape and number of air circulation holes 410, the four air circulation holes 420 may perform the same function as the circulation path of the air circulation holes 410 of FIG. 6A.

That is, the shape or number of air circulation holes formed at the upper surface of the heater housing 300 may be variously modified differently from those illustrated in FIGS. 6A and 6B, and are not limited to a particular embodiment. Although the shape or number of air circulation holes may vary, the function of the air circulation holes may be the same as the circulation path for discharging the air undergoing convection in the air circulation space formed between the inserted cigarette and the air circulation groove of the inner wall of the heater housing 300 or introducing the outside air into the air circulation space.

Figure 7:
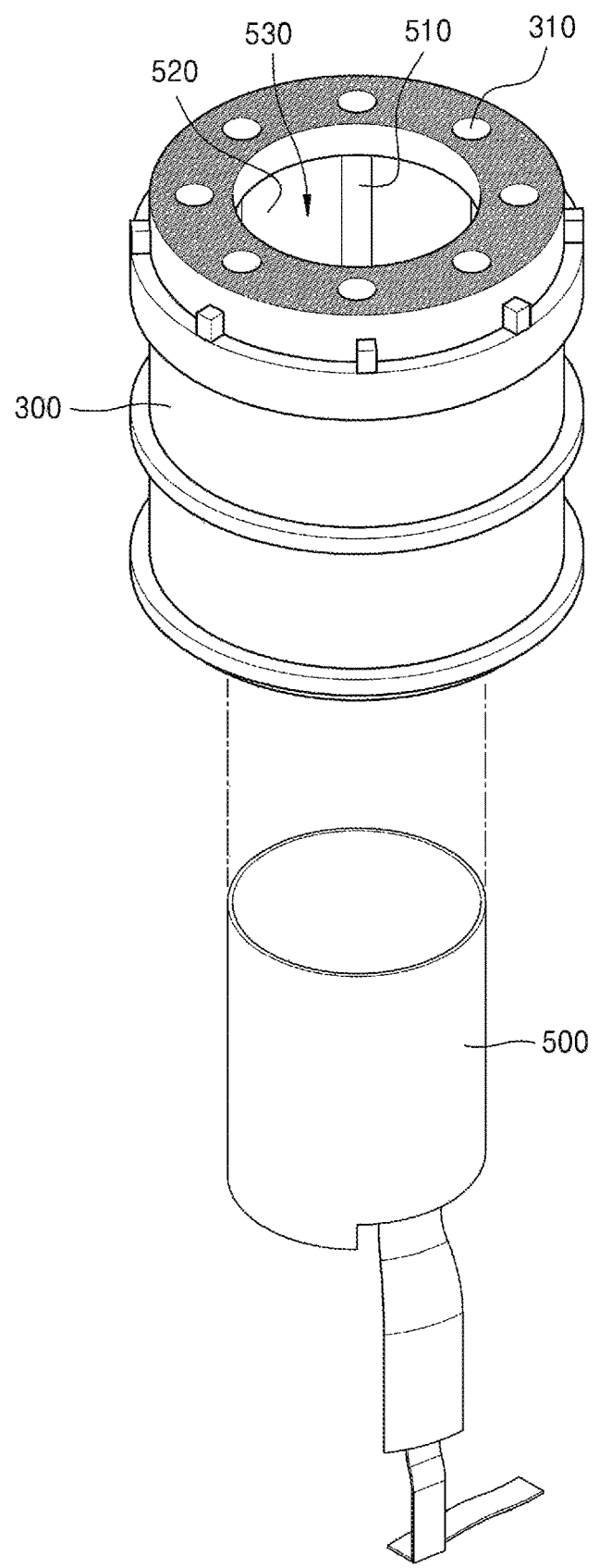
FIG. 7 is a diagram for describing a heater housing assembled in an upper protruding portion of a lower case and a heater assembled in the heater housing, according to an exemplary embodiment.

FIG. 7 is a diagram for describing a heater housing assembled in an upper protruding portion of a lower case and a heater assembled in the heater housing, according to an exemplary embodiment.

Referring to FIG. 7, a heater 500, for example, a cylindrical film heater, may be assembled on the inner surface of the heater housing 300. The cylindrical film heater may externally heat the inserted cigarette with a high temperature suitable for generating an aerosol while surrounding the cigarette inserted in the heater housing 300.

The heater housing 300 may include a cigarette accommodating cavity 530 for accommodating and supporting the inserted cigarette. At least one air circulation hole 310 may be formed at the upper surface of the heater housing 300. When the cigarette is inserted, the outside air may be introduced into the cigarette accommodating cavity 530 through the air circulation hole 310. Also, the heated air in the cigarette accommodating cavity 530 may be discharged to the outside.

At least one air circulation groove 510 may be formed at the inner surface of the heater housing 300 in the lengthwise direction of the heater housing 300, and the air circulation groove 510 may be connected to each air circulation hole 310 corresponding thereto. That is, the air circulation groove 510 may be formed to extend in the lengthwise direction in at least a portion of the inner wall thereof and may be connected to the air circulation hole 310.

Because the diameter of the inlet of the heater housing 300 through which the cigarette is inserted is almost similar to the diameter of the cigarette and the gap therebetween is very small, it may be difficult for an airflow path to be formed in the gap between the heater housing 300 and the inserted cigarette. Also, because an inner wall 520 of the heater housing 300 without the air circulation groove 510 almost contacts the inserted cigarette and thus the gap therebetween is small, it may also be difficult for an airflow path to be formed between the inner wall 520 of the heater housing 300 and the inserted cigarette.

However, because of an air circulation space between the cigarette and the heater housing 300 formed by the at least one air circulation groove 510, the air heated by the heater 500 may be discharged to the outside of the air circulation space or the cold outside air may be introduced into the air circulation space.

Figure 8A:
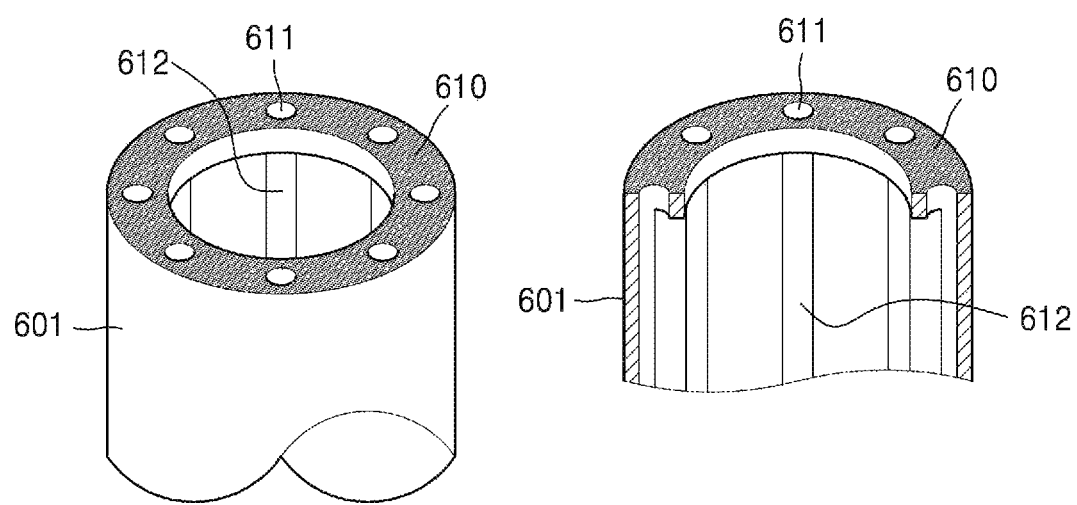
FIGS. 8A and 8B are diagrams for describing various exemplary embodiments of an air circulation groove of a heater housing.
Figure 8B:
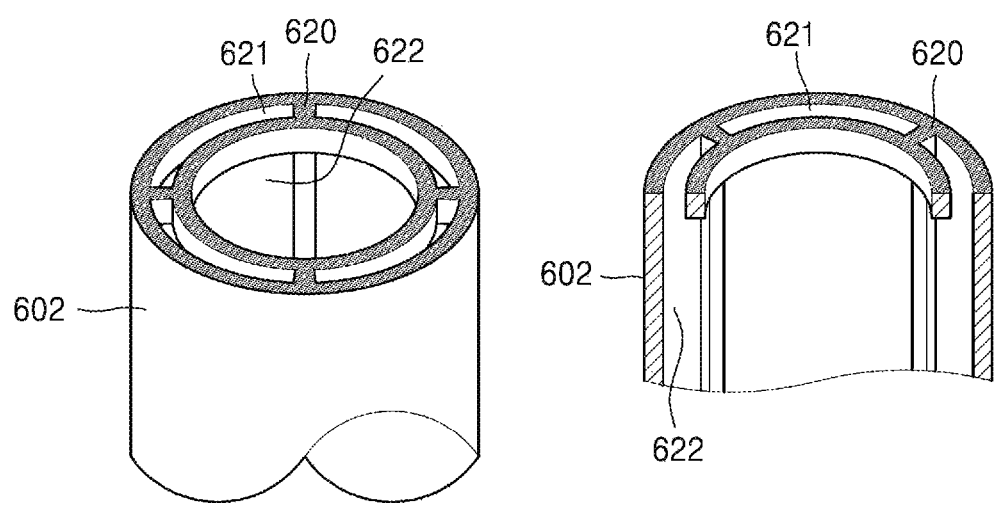

FIGS. 8A and 8B illustrate various exemplary embodiments of an air circulation groove of a heater housing.

Referring to FIG. 8A, a heater housing 601 may correspond to an upper portion of the heater housing 300 illustrated in FIG. 7. At least one circular air circulation hole 611 may be provided at an upper surface 610 of the heater housing 601, and at least one air circulation groove 612 may be formed at an inner surface of the heater housing 601. Each air circulation groove 612 may be connected to each circular air circulation hole 611 corresponding thereto.

Referring to FIG. 8B, as another exemplary embodiment different than the exemplary embodiment of FIG. 8A, an upper surface 620 of a heater housing 602 may be provided with at least one air circulation hole 621 extending along the circumference of the upper surface 620, and at least one air circulation groove 622 may be formed at an inner surface of the heater housing 602. Also, each air circulation groove 622 may be connected to each air circulation hole 621 corresponding thereto.

That is, the number and shape of the air circulation holes 611 and 621 and the air circulation grooves 612 and 622 formed at the upper surfaces 610 and 620 of the heater housings 601 and 602 are not limited to any particular embodiment, and they may be implemented in various numbers or various shapes.

Figure 9:
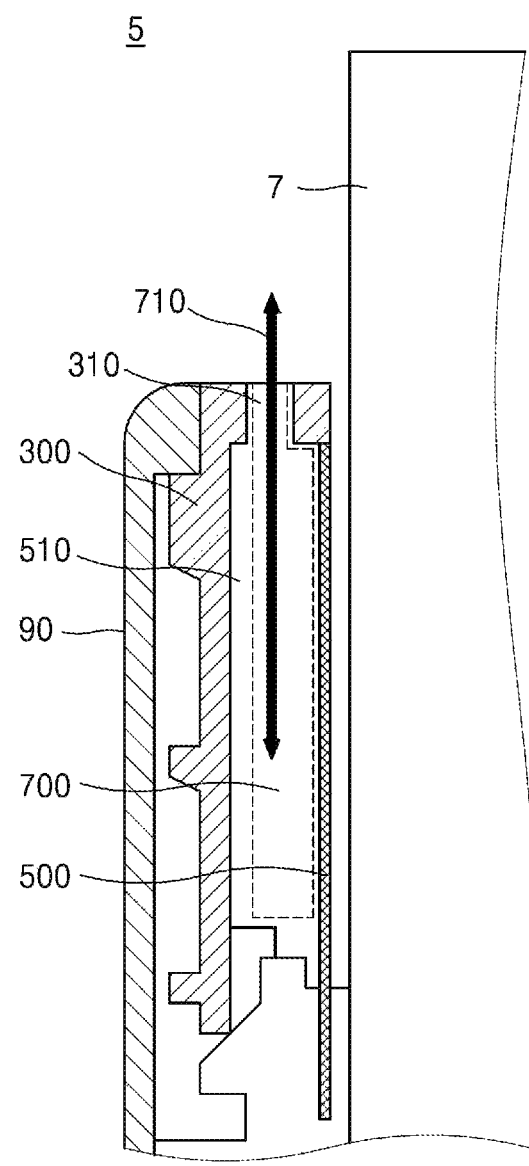
FIG. 9 is a cross-sectional view of a portion of an aerosol generating apparatus for describing an air circulation space formed between a heater housing and an inserted cigarette, according to an exemplary embodiment.

FIG. 9 is a cross-sectional view of a portion of an aerosol generating apparatus for describing an air circulation space formed between a heater housing and an inserted cigarette, according to an exemplary embodiment.

Referring to FIG. 9, the cigarette 7 is inserted in the upper protruding portion 90 of the aerosol generating apparatus 5 while the upper case 10 (see FIG. 4A) is detached from the upper protruding portion 90.

The heater housing 300 may be assembled in the upper protruding portion 90, and the heater 500 may be assembled in the heater housing 300. The heater 500 may be a cylindrical film heater for heating the outside of the cigarette 7, but the type of the heater 500 is not limited thereto.

At least one air circulation hole 310 may be formed at the upper surface of the heater housing 300. An empty space may be formed between the heater housing 300 and the cigarette 7, particularly between the heater 500 and the air circulation groove 510 formed at the heater housing 300, which may correspond to an air circulation space 700 described above. The inlet and outlet of the air circulation space 700 may be one air circulation hole 310, and the air circulation space 700 may have no airflow path formed other than the air circulation hole 310. That is, the air circulation space 700 may be enclosed without the air circulation hole 310. The air may be introduced into or discharged from the air circulation space 700 only along a path 710.

Figure 10:
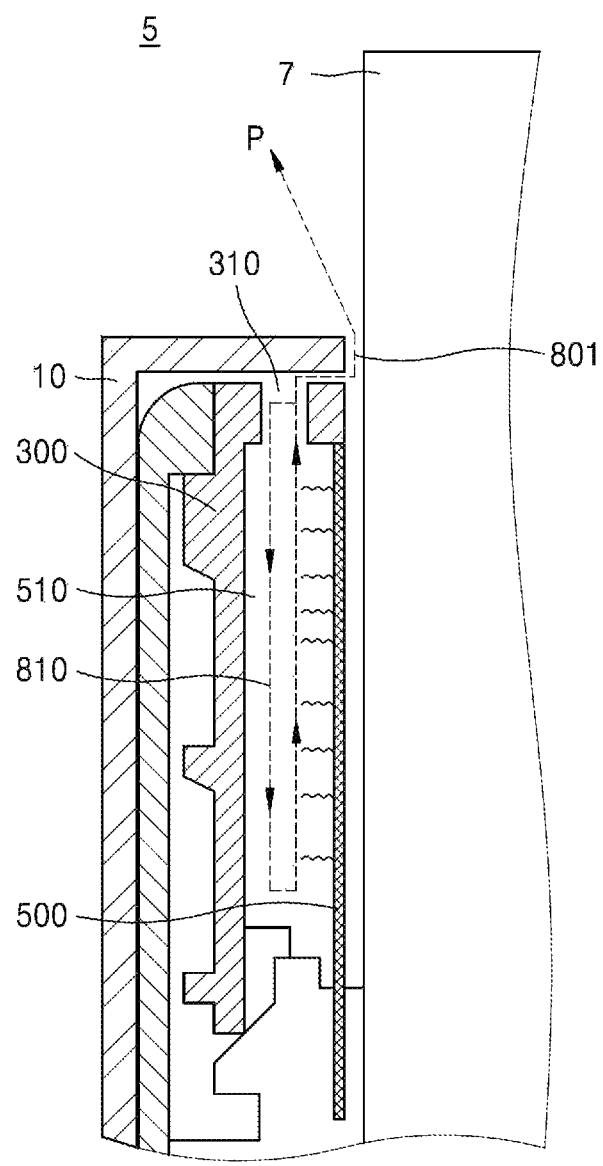
FIG. 10 is an enlarged view of a portion of an aerosol generating apparatus illustrating air flow in an air circulation hole and an air circulation space, according to an exemplary embodiment.

FIG. 10 is an enlarged view of a portion of an aerosol generating apparatus illustrating air flow in an air circulation hole and an air circulation space, according to an exemplary embodiment.

Referring to FIG. 10, the upper case 10 is coupled to the upper protruding portion 90. When the cigarette 7 is inserted in the aerosol generating apparatus 5, a slight gap 801 may be formed between the side end portion of the cigarette 7 and the upper case 10 and thus an airflow path P (810) may be formed through the inside of the upper protruding portion 90 and the heater housing 300.

Because the air circulation hole 310 is formed at the upper surface of the heater housing 300 and the air circulation groove 510 is formed between the heater housing 300 and the cigarette 7, the airflow path P (810) may be connected to the air circulation groove 510 through the air circulation hole 310.

When the heater 500 heats the cigarette 7 to generate aerosol, the temperature of the ambient air of the heater 500 may rise up to about the temperature of the heater 500 and thus the inside air may expand in the air circulation groove 510, which causes the air to circulate by convection. Thus, the heated air in the air circulation groove 510 may be discharged to the outside through the airflow path P (810). Also, because the air circulation groove 510 is connected to the outside through the airflow path P (810), the outside air may be introduced into the air circulation groove 510.

As the hot air in the air circulation groove 510 is discharged and the cold outside air is introduced into the air circulation groove 510 through the airflow path P (810), the air temperature in the air circulation groove 510 may be lowered. Accordingly, the heating temperature of the heater 500 such as a film heater for heating the cigarette 7 may be easily controlled and also the smoking satisfaction of the user of the aerosol generating apparatus 5 may be further improved.

Figure 11:
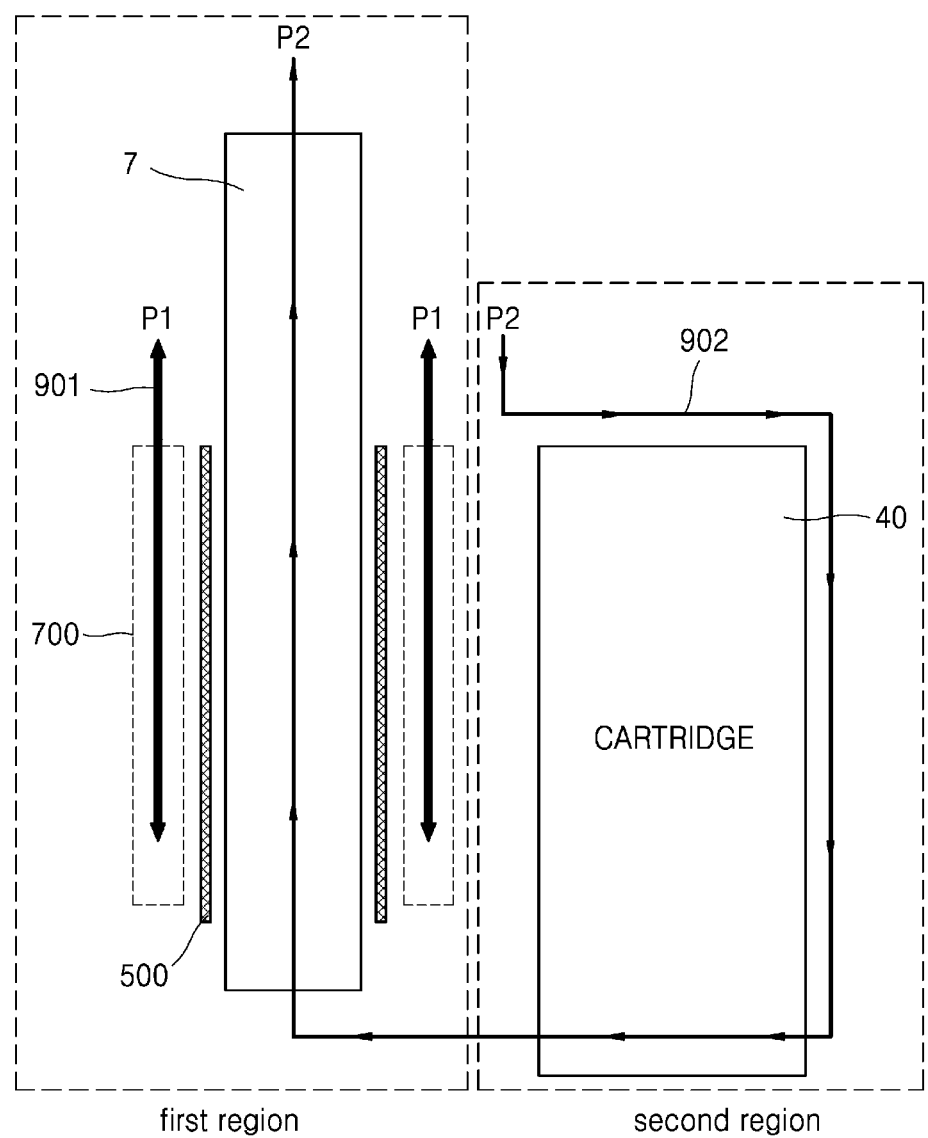
FIG. 11 is a diagram for describing a first airflow path P1 in an air circulation space, and a second airflow path P2 for aerosol inhalation, according to an exemplary embodiment.

FIG. 11 is a diagram for describing a first airflow path P1 in an air circulation space and a second airflow path P2 for aerosol inhalation, according to an exemplary embodiment.

Referring to FIG. 11, the aerosol generating apparatus 5 may include a first region where the cigarette 7 generates an aerosol, and a second region where the cartridge 40 generates an aerosol. The aerosols generated from the first region and the second region may be mixed in the cigarette 7 and inhaled by a user. A first airflow path P1 (901) circulating into the air circulation space 700 may not be connected to a second airflow path P2 (902) for aerosol inhalation.

While the cigarette 7 is mounted in the aerosol generating apparatus, when electricity is applied to a coil of a cartridge 40 and thus the coil heats a wick, the liquid of the wick may be vaporized and thus an aerosol may be initially generated. In this process, various flavor components included in the liquid of the cartridge 40 may be converted into aerosol.

When the user holds the cigarette by mouth and inhales air, the outside air may be introduced into the upper case 10 through the slot 16 of the upper case 10 (see FIG. 4A) to form the second airflow path P2 (902) inside the upper case 10. Although not illustrated in FIG. 12, the outside air may also be introduced through a coupling portion between the upper case 10 and the lower case 20 (see FIG. 4A) and then meet the second airflow path P2 (902).

The air introduced into the second airflow path P2 (902) may be mixed with primary aerosol that is initially generated in the cartridge 40 and then introduced into one end of the cigarette 7 through an aerosol outlet of the cartridge 40. Secondary aerosol may be generated when the primary aerosol contacts an aerosol generating material included in the cigarette 7 while passing through the cigarette 7, and the second airflow path P2 (902) may transmit the air containing both the primary aerosol and the secondary aerosol into the user's mouth as a final destination of the second airflow path P2 (902).

In the aerosol generating apparatus 5, the second airflow path P2 (902) for aerosol inhalation of the user may not meet the first airflow path P1 (901) for cooling the heater 500. That is, the first airflow path P1 (901) and the second airflow path P2 (902) may be formed along separate paths and may not be connected to each other.

Because the aerosol generating apparatus 5 includes the first airflow path P1 (901) for cooling the heater 500, separately from the second airflow path P2 (902) for aerosol inhalation, the aerosol generating apparatus 5 may control the heating temperature of the heater 500 easily and provide a better smoking experience to the user.

Those of ordinary skill in the art related to the present exemplary embodiments can understand that various changes in form and details can be made therein without departing from the scope of the characteristics described above. The disclosed methods should be considered in descriptive sense only and not for purposes of limitation. The scope of the present disclosure is defined by the appended claims rather than by the foregoing description, and all differences within the scope of equivalents thereof should be construed as being included in the present disclosure.

What is claimed is:

1. An aerosol generating apparatus comprising:
a heater housing configured to accommodate a cigarette and including:
at least one air circulation hole provided around an inlet through which the cigarette is inserted; and
at least one air circulation groove extending along a lengthwise direction in at least a portion of an inner wall of the heater housing and connected to the air circulation hole; and
a heater assembled in the heater housing and arranged to surround the cigarette accommodated in the heater housing for heating the cigarette,
wherein an air circulation space is formed between an outer surface of the heater and the air circulation groove,
wherein a first airflow path formed by the air circulation space and the air circulation hole for cooling the heater does not meet a second airflow path formed between an inside of the heater and an outside of the aerosol generating apparatus for an inhalation of an aerosol generated from the cigarette.

2. The aerosol generating apparatus of claim 1, wherein the first airflow path includes an airflow path for discharging air heated by the heater to outside through the air circulation hole.

3. The aerosol generating apparatus of claim 1, wherein air outside the heater is heated by the heater and circulates by convection in the air circulation space.

4. The aerosol generating apparatus of claim 1, wherein outside air flows into the air circulation space and air inside the air circulation space flows out, through the air circulation hole.

5. The aerosol generating apparatus of claim 1, wherein the at least one air circulation hole is provided spaced apart from each other along a circumferential direction on an upper surface around the inlet through which the cigarette is inserted in the heater housing.

6. The aerosol generating apparatus of claim 1, wherein a number of the at least one air circulation groove is equal to a number of the at least one air circulation hole.

7. The aerosol generating apparatus of claim 1, wherein the heater includes a cylindrical film heater for heating an outer surface of the cigarette.

8. An aerosol generating apparatus comprising:
a first region accommodating and heating a cigarette which is a solid aerosol generating source; and
a second region accommodating a cartridge which accommodates and heats a liquid aerosol generating source,
wherein the first region comprises:
a heater housing configured to accommodate the cigarette and including at least one air circulation hole provided around an inlet through which the cigarette is inserted and at least one air circulation groove extending along a lengthwise direction in at least a portion of an inner wall of the heater housing and connected to the air circulation hole; and
a heater assembled in the heater housing and arranged to surround the cigarette accommodated in the heater housing for heating the cigarette,
wherein an air circulation space is formed between an outer surface of the heater and the air circulation groove,
wherein a first airflow path formed by the air circulation space and the air circulation hole for cooling the heater does not meet a second airflow path formed for an inhalation of an aerosol generated from the cigarette accommodated in the first region and the cartridge accommodated in the second region, and
wherein the second airflow path is an airflow path through which a primary aerosol generated by vaporizing the liquid aerosol generating source in the cartridge and a secondary aerosol generated while the primary aerosol passes through the cigarette are mixed.

* * * * *